United States Patent [19]
Wilber

[11] Patent Number: 5,614,793
[45] Date of Patent: Mar. 25, 1997

[54] DEFLECTION CIRCUIT RESPONSIVE TO DIFFERENTIAL SAWTOOTH SIGNALS

[75] Inventor: James A. Wilber, Indianapolis, Ind.

[73] Assignee: Thomson Consumer Electronics, Inc., Indianapolis, Ind.

[21] Appl. No.: 630,032

[22] Filed: Apr. 9, 1996

[51] Int. Cl.⁶ .............................. H01J 29/70; H01J 29/76
[52] U.S. Cl. ............................................ 315/403; 315/388
[58] Field of Search .................................. 315/403, 387, 315/388, 389, 396, 397

[56] References Cited

U.S. PATENT DOCUMENTS 5,359,267  10/1994  Wilber ...................................... 315/403

OTHER PUBLICATIONS

TDA8350Q –Philips Semiconductors –DC–coupled vertical deflection and East–West output circuit.
TDA9151B –Philips Semincoductors–Programmable deflection controller.

Primary Examiner—Theodore M. Blum
Attorney, Agent, or Firm—Joseph S. Tripoli; Joseph J. Laks; Sammy S. Henig

[57] ABSTRACT

A pair of current sources, each having a high output impedance, are coupled to a pair of first and second inputs of a differential input stage of a vertical deflection amplifier. An output of the amplifier is coupled to a vertical deflection winding. A current sampling resistor is coupled to the first input via a first resistor. The second input is coupled via a second resistor to a terminal of the sampling resistor that is remote from the first resistor. The first and second resistors are matched resistors for providing differential driving.

8 Claims, 3 Drawing Sheets

DEFLECTION CIRCUIT RESPONSIVE TO DIFFERENTIAL SAWTOOTH SIGNALS

The invention relates to a video display deflection apparatus.

U.S. Pat. No. 5,359,267, entitled VERTICAL DEFLECTION WITH VERTICAL SHRINK MODE, in the name of Wilber, discloses a DC-coupled vertical deflection circuit that is responsive to a pair of differential sawtooth voltages. The sawtooth voltages are applied via a pair of emitter followers, each having a low output impedance. A pair of resistors of a resistor network couple the sawtooth voltages to the inverting and non-inverting input terminals, respectively, of a deflection amplifier to drive the amplifier differentially. A feedback resistor of the resistor network is used for combining a feedback signal representative of the deflection current with a current that is produced by one of the sawtooth voltages.

The advantages of differential driving are that it can reduce undesirable DC current drift in the deflection winding and it can increase the degree of common mode rejection with respect to noise signal components. To achieve such advantages, the resistor network of the Wilber patent includes four matched resistors. It may be desirable to reduce the number of resistors in the network in order to reduce the complexity of the circuit and, thereby, the number of resistors that have to be matched.

In accordance with an inventive feature, a pair of differential sawtooth currents are generated in a pair of current sources, each having a high output impedance. The sawtooth currents are coupled to a pair of resistors and to a pair of inputs of the amplifier to provide for differential driving. One of the pair of resistors couples a feedback signal to one of the inputs of the amplifier. Advantageously, because each of the current sources has the high output impedance, matching of only two resistors is sufficient for attaining the aforementioned advantages of differential driving.

The same two resistors that are used for providing differential driving, also determine the amplitude of the deflection current for a given amplitude of the sawtooth current. Therefore, the same type of integrated circuit that generates each of the sawtooth currents at a constant amplitude can be used in different vertical deflection circuits that are required to produce deflection currents at different amplitudes. By selecting the appropriate value for the pair of resistors, a desirable scale factor is obtained in each of such vertical deflection circuits. Advantageously, because the output impedance is substantially higher than that of each of the resistors of the network, the current sources do not degrade the matching of the resistors of the resistor network.

A video deflection apparatus, embodying an aspect of the invention includes a cathode ray tube and a deflection winding mounted on a neck of the cathode ray tube. A deflection amplifier is coupled to the deflection winding and has first and second inputs for generating a deflection current in the deflection winding. A current sampling resistor is coupled to the deflection winding for generating a feedback signal that is coupled to one of first and second resistors. A sawtooth signal generator generates a pair of differential, first and second sawtooth currents at a frequency that is related to a deflection frequency coupled to the first and second resistors. First and second voltages are developed and coupled to the first and second inputs, respectively, to control the deflection current, in accordance with each of the first sawtooth current, the second sawtooth current and the feedback signal. The sawtooth generator has an output impedance in a current path that includes one of the first and second resistors that is substantially higher than that of one of the first and second resistors.

Figure 1:
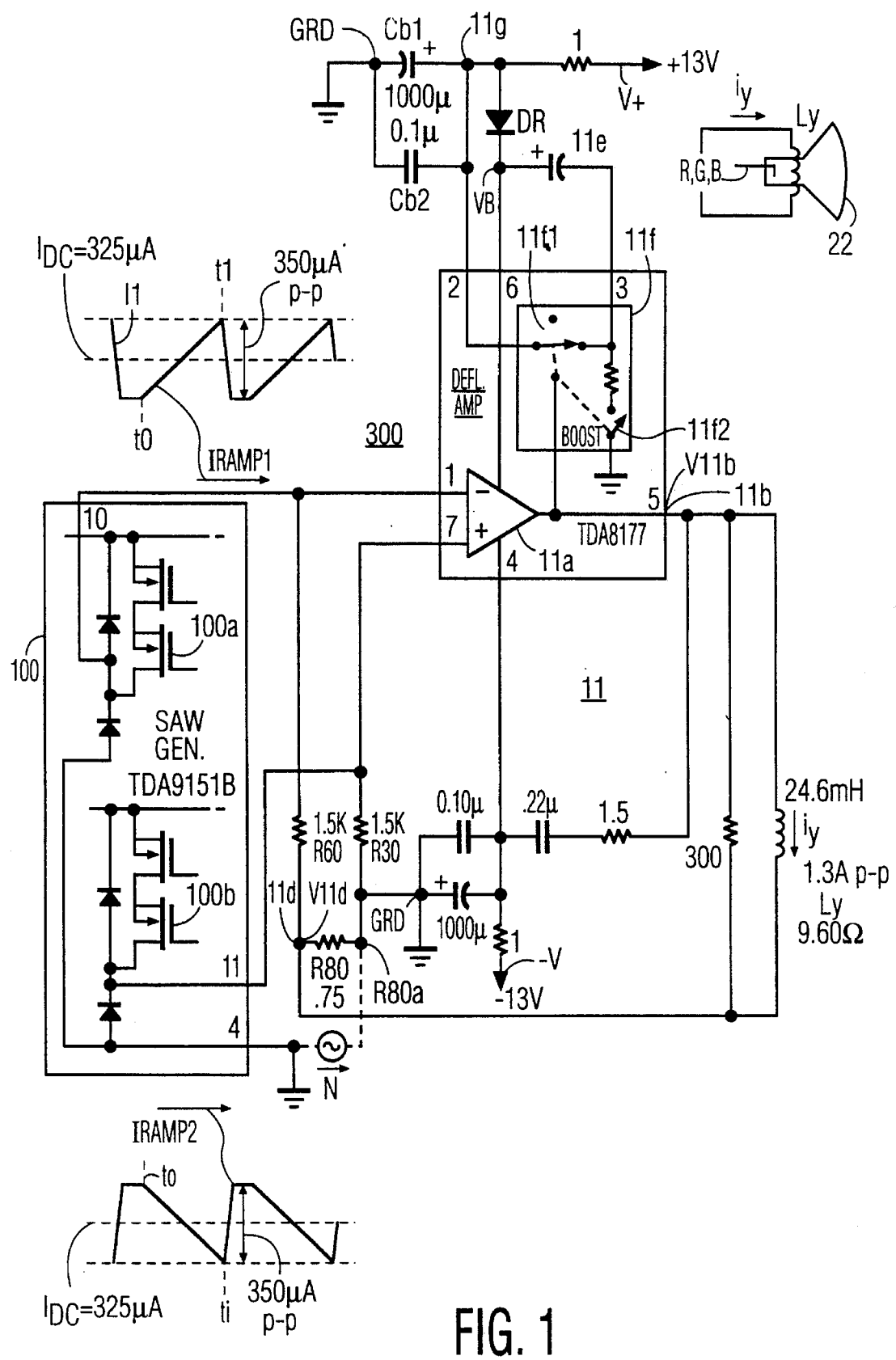
FIG. 1 illustrates an inventive embodiment of a vertical deflection circuit.

A sawtooth current generator 100 of FIG. 1, of a vertical deflection circuit 300, generates a pair of differential or complementary vertical sawtooth current signals IRAMP1 and IRAMP2. Signals IRAMP1 and IRAMP2 are generated at pins 10 and 11 of a deflection controller TDA9151B made by Philips Semiconductors by a pair of transistors, 100a and 100b, respectively. Signals IRAMP1 and IRAMP2 change in opposite directions, during a vertical trace interval t0–t1.

A DC coupled deflection circuit output stage 11 is controlled by signals IRAMP1 and IRAMP2. In stage 11, a deflection winding Ly provides vertical deflection in a cathode ray tube (CRT) 22, for example of the type A89AFF10X01. Winding Ly is coupled in series with a deflection current sampling resistor R80. Winding Ly and resistor R80 form a series arrangement that is coupled between an output terminal 11b of a deflection amplifier 11a and a reference or ground terminal GRD. Amplifier 11a may be of the type TDA 8177 or TDA 8172. A supply voltage V+, for example +13 volts, is coupled to an anode terminal 11g of a boost voltage generating diode DR. A cathode of diode DR is coupled to a positive supply terminal, pin 6, of amplifier 11a. A negative supply voltage V−, for example −13 volts, is coupled to a negative supply terminal, pin 4, of amplifier 11a. A junction terminal 11d, coupled between winding Ly and resistor R80, is coupled via a feedback resistor R60 to an inverting input terminal of amplifier 11a. Ground terminal GRD of resistor R80 is coupled via a resistor R30 to a noninverting input terminal of amplifier 11a. A negative feedback voltage across resistor R80, representing the current in deflection coil Ly, is applied to the inverting input terminal of amplifier 11a.

Amplifier 11a develops an output voltage as needed to cause deflection winding current iy to track a difference between differential current signals IRAMP1 and IRAMP2. Sawtooth current signals IRAMP1 and IRAMP2 are coupled to the noninverting and inverting input terminals, respectively, of amplifier 11a for controlling deflection current iy.

Each of signals VRAMP1 and VRAMP2 switches direction at time t1, at an end of the vertical trace interval. Deflection amplifier 11a then ceases operating in a feedback mode and a boosted voltage VB at supply pin 6 of amplifier 11a is applied to deflection winding Ly via output terminal 11b. A retrace voltage V11b is produced immediately after time t1 to enable deflection current iy to complete retrace by time t0, at the beginning of trace. Switch 11f1 of a boost stage 11f causes a pair of decoupling capacitors Cb1 and Cb2, that are coupled in parallel, to be coupled in series with a boost capacitor 11e. Capacitor 11e is charged via a switch 11f2 from the +13V supply voltage V+, during vertical trace. A supply voltage, developed across filter capacitors Ca and Cb, is summed up with a voltage developed across boost capacitor 11e so as to form boost voltage VB. Voltage VB is decoupled from the +13V supply voltage V+ via diode DR, when boost voltage VB is formed. Consequently, vertical retrace voltage V11b at terminal 11b is larger than voltage V+, causing a fast retrace.

When deflection current iy has increased in value to a level which permits linear operation of amplifier 11a, feedback from sampling resistor R80 enables the deflection current to follow signals IRAMP1 and IRAMP2. Then, deflection amplifier 11a, operating in its linear feedback mode, produces the sawtooth trace portion of deflection current iy.

During trace interval, t0–t1, a feedback voltage V11d at terminal 11d of current sampling resistor R80 is equal to a difference between the product of the value of signal IRAMP2 and the value of resistor R30 and between the product of the value of signal IRAMP1 and the value of resistor R60. Resistors R60 and R30 are matched resistors of equal value that track each other in production tolerances and when temperature variations occur. Deflection current iy is equal to a difference between current signals IRAMP1 and IRAMP2 multiplied by the ratio between the value of, for example, resistor R60 or R30 and resistor R80.

In practice, each of signals IRAMP1 and IRAMP2 may include a portion of undesirable current noise component. The current noise signal components may occur because of electromagnetic fields or voltage differences along ground conductor GRD. When the impedances that are developed at the inverting and non-inverting input terminals of amplifier 11a are matched, deflection current iy is linearily proportional to the difference between current signals IRAMP1 and IRAMP2a. Therefore, any current noise signal component, included in signal IRAMP1, can be compensated by an equal current noise signal component, included in signal IRAMP2, in a manner not to affect current iy. Such noise signal reduction is referred to as common mode rejection.

An output impedance developed by transistors 100a and 100b at each of pins 10 and 11, respectively, of deflection controller TDA9151B, forming sawtooth generator 100, is high. Such high output impedance is greater than 1MΩ. Because each of current signals IRAMP1 and IRAMP2 is produced in a corresponding current path having a high output impedance, the value of each current signals IRAMP1 and IRAMP2 does not depend on any resistor external to deflection controller TDA9151B.

In accordance with an inventive feature, because current signals IRAMP1 and IRAMP2 are not dependent on external resistors, the degree of common mode rejection is determined by the matching of merely two resistors, resistors R30 and R60. Because only two resistors, R30 and R60, have to be matched, the circuit is, advantageously, simplified. As a result of the output impedance at each of pins 10 and 11 of sawtooth generator 100 being high, sawtooth generator 100 is prevented from degrading the matching of resistors R60 and R30. Moreover, the effect on current signals IRAMP1 and IRAMP2 of any noise signal that could be coupled to sawtooth generator 100 from ground conductor GRD, for example, via resistor R30 or R60, is substantially reduced. Therefore, a further noise immunity is, advantageously, obtained.

A simulation of the effect on deflection current iy of a typical noise signal N of 50mV at a wide frequency range, developed between a ground terminal, pin 4, of sawtooth generator 100 and ground terminal GRD, at the junction between resistors R80 and R30 has been performed. For simulation purposes, current signals IRAMP1 and IRAMP2 were established as constant, equal currents instead of sawtooth currents. Resistors R30 and R60 were assumed to be 1515 ohms and 1485 ohms, respectively. Such values of resistors R30 and R60 represent the worst case matching for resistors R30 and R60, each having a nominal value of 1500 ohms having a tolerance range of ±1%. The parameters of amplifier 11a were approximated.

Figure 2:
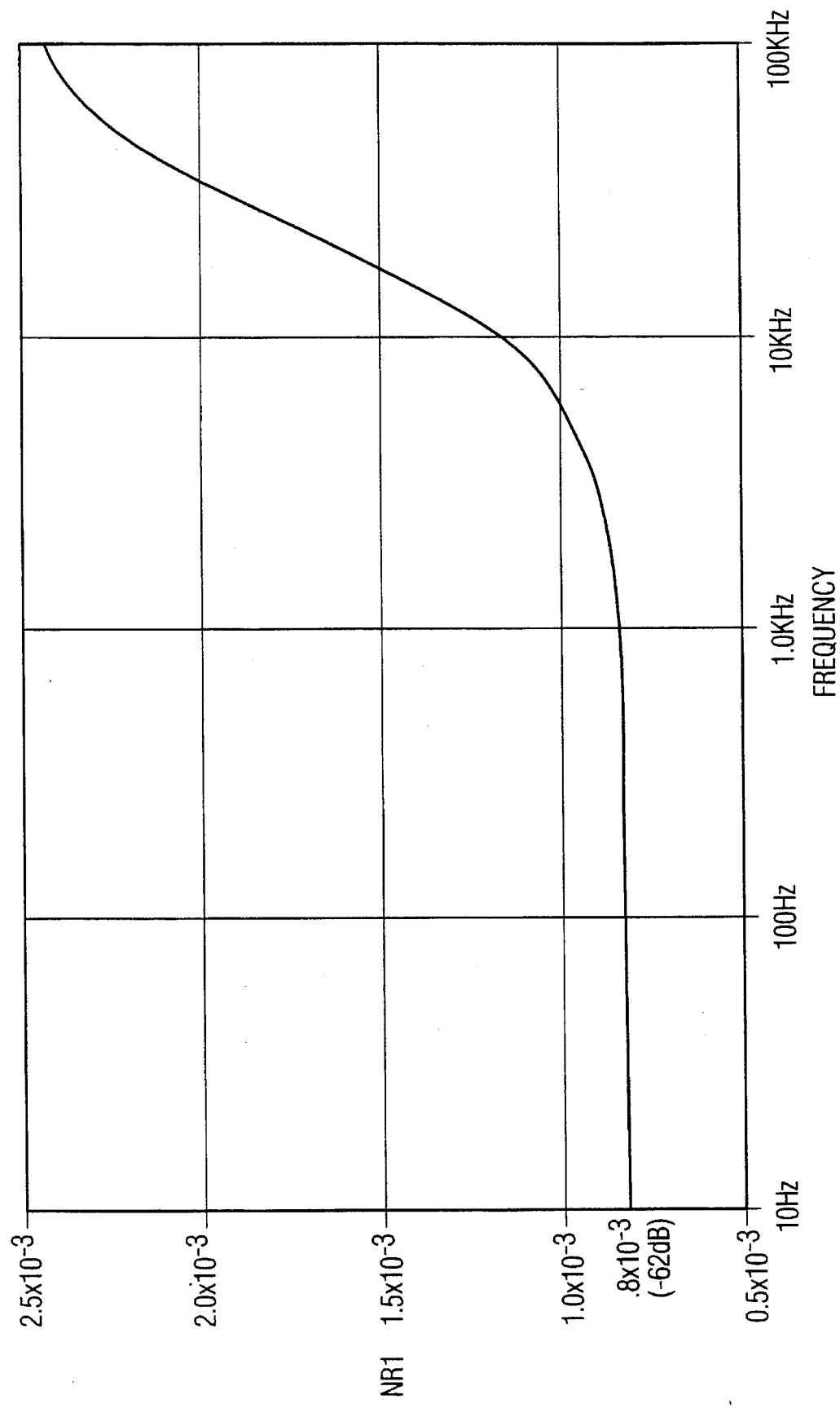
FIG. 2 illustrates a graph depicting the degree of noise rejection of the arrangement of FIG. 1.

FIG. 2 illustrates a graph depicting a ratio NR1, as a function of frequency, between a noise voltage V11d, developed in resistor R80, when noise signal N of 50mV is introduced, and the magnitude of noise signal N. The 50mV noise signal N produces the noise voltage component of voltage V 11d. As shown in FIG. 2, ratio NR1 at, for example, 1kHz is approximately –62dB.

A similar simulation was performed for a vertical deflection circuit that is similar to that of FIG. 1 except for being driven by a pair of differential voltages, not shown, produced by corresponding voltage sources, not shown, having low output impedances. The pair of differential voltages are coupled to resistors having the same values as resistors R60 and R30, via a pair of resistors, not shown, having the worst case values of 1485 ohm and 1515 ohm, respectively. In such arrangement, the resistor network includes four resistors that is similar to that described in the Wilber patent. For the purpose of simulation, each of the differential voltages is assumed to be a constant voltage. A similar noise signal of 50mV is introduced in the simulation in a similar manner to that described before.

Figure 3:
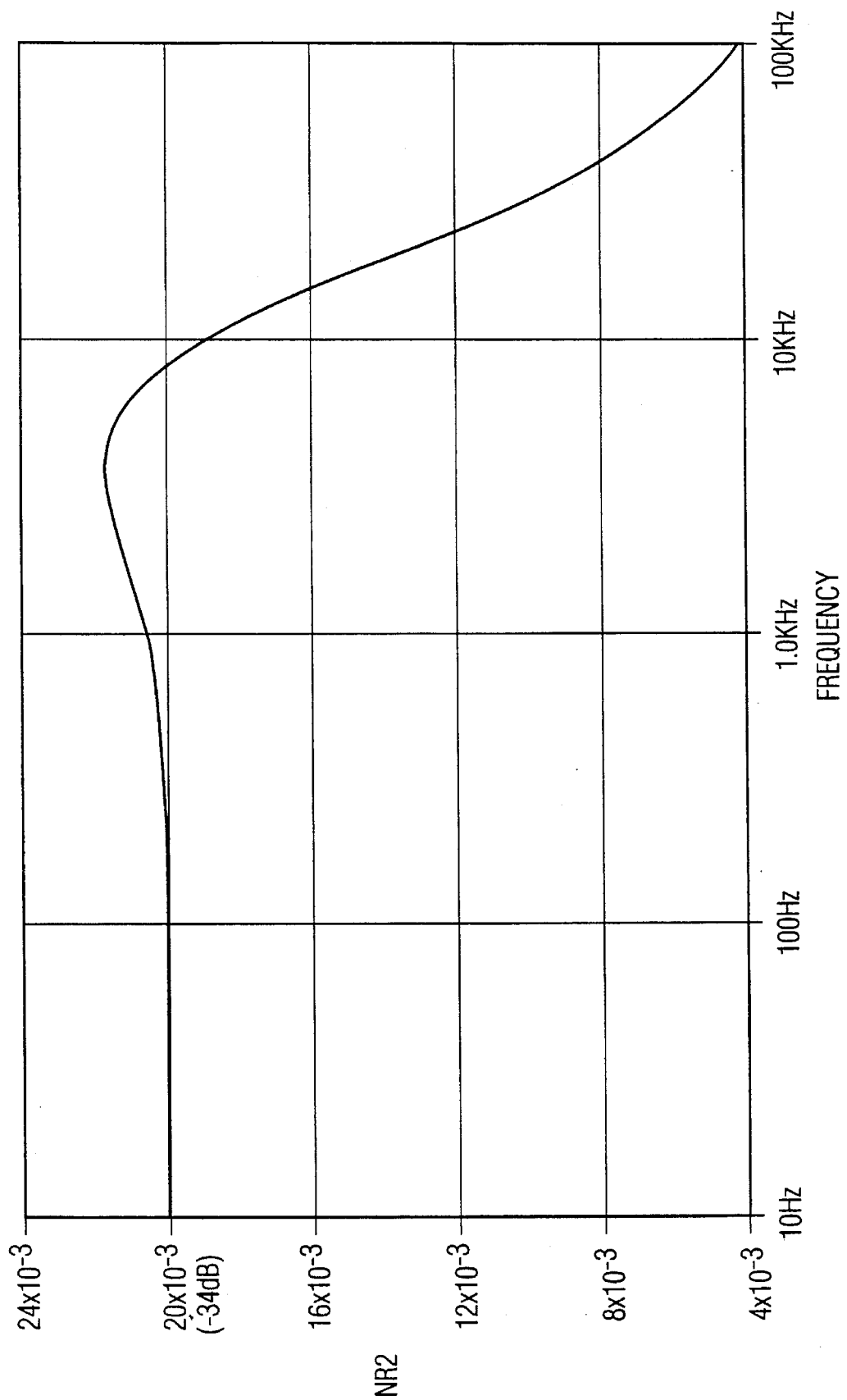
FIG. 3 illustrates a graph depicting the degree of noise rejection of a prior art arrangement.

FIG. 3 illustrates, for comparison purposes, a graph depicting a ratio NR2, as a function of frequency, between a noise voltage that is analogous to noise voltage V11d, developed across the corresponding current sampling resistor, and the 50mV noise signal. The graph of FIG. 3 is applicable to the aforementioned vertical that is similar to that described in the Wilber patent in which the sawtooth generator has a low output impedance.

As shown in FIG. 3, the ratio NR2 at 1 kHz between the noise voltage component across the sampling resistor that is analogous to noise voltage V11d and the 50mV noise signal is approximately –34dB. Ratio NR2 is substantially larger than ratio NR1. Thus, the arrangement of FIG. 1 provides a higher degree of common mode rejection.

What is claimed is:

1. A video deflection apparatus, comprising:

a cathode ray tube;

a deflection winding mounted on a neck of said cathode ray tube;

a deflection amplifier coupled to said deflection winding and having a pair of first and second inputs for generating a deflection current in said deflection winding;

a pair of first and second resistors;

a current sampling resistor coupled to said deflection winding for generating a feedback signal that is coupled to one of said first and second resistors;

a sawtooth signal generator for generating a pair of differential, first and second sawtooth currents at a frequency that is related to a deflection frequency coupled to said first and second resistors, to develop, in accordance with each of said first sawtooth current, said second sawtooth current and said feedback signal, first and second voltages that are coupled to said first and second inputs, respectively, to control said deflection current, said sawtooth generator having an output impedance in a current path that includes one of said first and second resistors that is substantially higher than that of one of said first and second resistors, such that a current in said current path is substantially independent of said one resistor included in said current path.

2. A video deflection apparatus according to claim 1 wherein said sawtooth generator exhibits an output impedance in a current path that includes the other one of said first and second resistors that is substantially higher than that of the other one resistor.

3. A video deflection apparatus according to claim 2 wherein said first and second resistors are matched resistors.

4. A video deflection apparatus according to claim 1 wherein said current sampling resistor is coupled to said first resistor and wherein said first sawtooth current is coupled to a terminal of said first resistor that is remote from said current sampling resistor.

5. A video deflection apparatus according to claim 1 wherein said deflection current tracks in a feedback mode a difference between said first and second currents, during a trace interval, and wherein, during a retrace interval, the operation in said feedback mode ceases.

6. A video deflection apparatus according to claim 1 wherein said first and second inputs are differential inputs of said deflection amplifier.

7. A video deflection apparatus according to claim 1 wherein said first sawtooth current does not flow in said second resistor and said second sawtooth current does not flow in said first resistor.

8. A video deflection apparatus according to claim 1 wherein said first and second sawtooth current are DC-coupled to said deflection winding.

* * * * *

Disclaimer 5,614,793—James A. Wilber, Indianapolis, Ind. DEFLECTION CIRCUIT RESPONSIVE TO DIFFERENTIAL SAWTOOTH SIGNALS. Patent dated March 25, 1997. Disclaimer filed June 6, 1997, by the assignee, Thomson Consumer Electronics, Inc.

Hereby enters this disclaimer to claims 1-8 of said patent.

*(Official Gazette,* September 9, 1997)